United States Patent
Xiao et al.

(10) Patent No.: US 8,865,593 B2
(45) Date of Patent: Oct. 21, 2014

(54) METAL SILICIDE LAYER, NMOS TRANSISTOR, AND FABRICATION METHOD

(71) Applicants: Haibo Xiao, Shanghai (CN); Wayne Bao, Shanghai (CN); Yanlei Ping, Shanghai (CN)

(72) Inventors: Haibo Xiao, Shanghai (CN); Wayne Bao, Shanghai (CN); Yanlei Ping, Shanghai (CN)

(73) Assignee: Semiconductor Manufacturing International Corp, Shanghai (CN)

( * ) Notice: Subject to any disclaimer, the term of this patent is extended or adjusted under 35 U.S.C. 154(b) by 0 days.

(21) Appl. No.: 13/654,518

(22) Filed: Oct. 18, 2012

(65) Prior Publication Data

US 2013/0341687 A1    Dec. 26, 2013

(30) Foreign Application Priority Data

Jun. 26, 2012    (CN) .......................... 2012 1 0214745

(51) Int. Cl.
*H01L 29/78* (2006.01)
*H01L 21/285* (2006.01)

(52) U.S. Cl.
USPC .... 438/655; 438/299; 257/288; 257/E29.255; 257/E21.16; 257/E21.409

(58) Field of Classification Search
CPC ...... H01L 21/285; H01L 29/78; H01L 21/336
USPC ............ 257/288, E29.255, E21.16, E21.409; 438/655, 299
See application file for complete search history.

(56) References Cited

U.S. PATENT DOCUMENTS

| | | | |
|---|---|---|---|
| 6,204,177 B1 * | 3/2001 | Besser et al. .................. | 438/683 |
| 2002/0093101 A1 * | 7/2002 | Iyer et al. ...................... | 257/758 |
| 2002/0102848 A1 * | 8/2002 | Xiang et al. .................. | 438/682 |
| 2006/0079087 A1 * | 4/2006 | Kawamura et al. ........... | 438/664 |
| 2006/0154474 A1 | 7/2006 | Chen et al. | |
| 2008/0064156 A1 * | 3/2008 | Ikeda ............................ | 438/199 |
| 2008/0116494 A1 * | 5/2008 | Goldbach et al. ............. | 257/288 |
| 2008/0299720 A1 * | 12/2008 | Carruthers et al. ........... | 438/199 |
| 2008/0303171 A1 * | 12/2008 | Ito et al. ........................ | 257/774 |
| 2009/0134479 A1 * | 5/2009 | Kamimuta et al. ........... | 257/410 |
| 2011/0011632 A1 * | 1/2011 | Nakao et al. .................. | 174/257 |
| 2011/0169105 A1 * | 7/2011 | Okubo .......................... | 257/411 |
| 2013/0178024 A1 * | 7/2013 | Flachowsky et al. ......... | 438/199 |

* cited by examiner

*Primary Examiner* — Kevin Parendo
*Assistant Examiner* — Lamont Koo
(74) *Attorney, Agent, or Firm* — Anova Law Group, PLLC

(57) ABSTRACT

Exemplary embodiments provide materials and methods for forming a metal silicide layer and/or an NMOS transistor. The metal silicide layer can be formed by heating a metal layer containing at least a tellurium element on a semiconductor substrate. The metal silicide layer can thus contain at least the tellurium element on the semiconductor substrate. The metal silicide layer can be formed in an NMOS transistor. With the addition of tellurium element in the metal silicide layer, Schottky barrier height between the metal silicide layer and the underling semiconductor substrate can be reduced. Contact resistance of the NMOS transistor can also be reduced.

16 Claims, 9 Drawing Sheets

METAL SILICIDE LAYER, NMOS TRANSISTOR, AND FABRICATION METHOD

CROSS-REFERENCES TO RELATED APPLICATIONS

This application claims the priority of Chinese patent application No. CN201210214745.9, filed on Jun. 26, 2012, which is incorporated herein by reference in its entirety.

FIELD OF THE DISCLOSURE

The present disclosure relates to the field of semiconductor manufacturing technology and, more particularly, relates to materials and methods of forming a metal silicide layer and/or NMOS transistors.

BACKGROUND

As technology node shrinks, low electrical resistance is required for interconnect structures of semiconductor devices for overcoming resistor-capacitor (RC) delay. Metal silicide is widely used as electrical contacts and leads of transistors, due to its low electrical resistance and high adhesion to silicon material. Problems arise, however, because continuous scaling in manufacturing presents significant challenges to silicide engineering for high performance devices such as complementary metal-oxide-semiconductor (CMOS) logic devices. One of such challenges is to reduce source/drain contact resistances of CMOS devices.

Conventional methods for forming a metal silicide layer include steps as shown in FIGS. 1-3. Referring to FIG. 1, there is provided a semiconductor substrate 10 having a transistor formed thereon. The transistor includes a gate structure 11 on the substrate 10, a sidewall spacer 12 surrounding the gate structure 11, a source region 10a, and a drain region. The gate structure 11 may include a gate dielectric layer and a gate electrode as known in the art.

Referring to FIG. 2, a metal layer 13 is formed on the transistor structure shown in FIG. 1. The metal layer 13 can be formed of materials depending on types of metal silicide to be formed. For example, if a corresponding metal silicide (e.g., layer 14 in FIG. 3) is titanium silicide or nickel silicide, the metal layer 13 may be formed of a material containing titanium element or nickel element.

FIG. 3 shows a metal silicide layer 14 formed by heating the transistor structure shown in FIG. 2. During heating, the metal layer 13 reacts with the silicon material of the gate structure 11, the source region 10a, and the drain region 10b, whereby forming the metal silicide layer 14 as shown in FIG. 3. Unreacted portion of the metal layer 13 is subsequently washed off by acid.

During formation of metal silicides, material thermal stability plays an important role. For example, structure recombination and phase transformation may occur during heating due to undesired thermal stability of a metal silicide. In addition, device shrinkage may reduce thermal stability of the metal silicide.

Existing solutions to enhance thermal stability include addition of platinum (Pt) element in the metal silicides. For PMOS transistors, when a metal silicide layer containing Pt is used, Schottky barrier height (SBH) may be reduced at the interface between the metal silicide layer and the silicon material, thereby reducing the contact resistance of the PMOS transistor. As for NMOS transistors, however, use of metal silicide layer containing Pt does not reduce contact resistance.

Thus, there is a need to overcome these and other problems of the prior art and to provide materials and methods of forming a metal silicide layer and/or NMOS transistors with reduced contact resistance.

BRIEF SUMMARY OF THE DISCLOSURE

One aspect of the present disclosure includes a method for fabricating a semiconductor structure. In this method, a metal layer containing at least a tellurium element can be formed on a semiconductor substrate, which can then be heated to form a metal silicide layer on the semiconductor substrate. The metal silicide layer can include at least the tellurium element.

Another aspect of the present disclosure includes a method for forming a semiconductor device. In this method, a metal layer containing at least a tellurium element can be formed over an NMOS transistor including a source region, a drain region, and a gate structure. The metal layer over the NMOS transistor can then be heated to form a metal silicide layer at least on the source region and the drain region. The metal silicide layer can include at least the tellurium element.

Yet another aspect of the present disclosure includes a semiconductor device. The semiconductor device can include an NMOS transistor on a semiconductor substrate. The NMOS transistor can include a source region, a drain region, and a gate structure. The semiconductor device can also include a metal silicide layer disposed at least on the source region and the drain region. The metal silicide layer can include at least a tellurium element.

It is to be understood that both the foregoing general description and the following detailed description are exemplary and explanatory only and are not restrictive of the invention, as claimed. Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Exemplary embodiments provide materials and methods for forming a metal silicide layer and/or an NMOS transistor. The metal silicide layer can be formed by heating a metal layer containing at least a tellurium element on a semiconductor substrate. The metal silicide layer can thus contain at least the tellurium element on the semiconductor substrate. The metal silicide layer can be formed in an NMOS transistor. With the addition of tellurium element in the metal silicide layer, Schottky barrier height between the metal silicide layer and the underling semiconductor substrate can be reduced. Contact resistance of the NMOS transistor can also be reduced.

In a certain embodiment, tellurium (Te) element can be incorporated in a metal silicide layer by using, e.g., Te doped Ti target. For example, Te element can be incorporated in an exemplary TiN capping layer. The TiN capping layer can be disposed on a metal layer containing NiPt, which is in turn disposed on a silicon (Si) substrate. When heated (i.e., when the silicide thermal process carries out), Te atoms can diffuse to the NiPtSi/Si interface, which can remarkably reduce SBH and thus reduce contact resistance of NMOS transistors. Various embodiments may also include formation of PMOS transistors, wherein the PMOS transistors can have a metal silicide layer, e.g., formed from a Ti target with or without Te.

Figure 1:
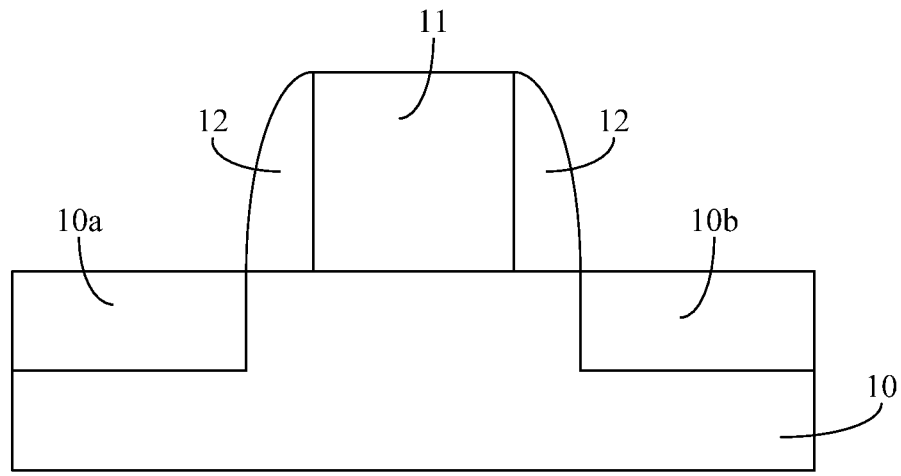
FIG. 1 through FIG. 3 are schematics of a semiconductor structure including a metal silicide layer.
Figure 2:
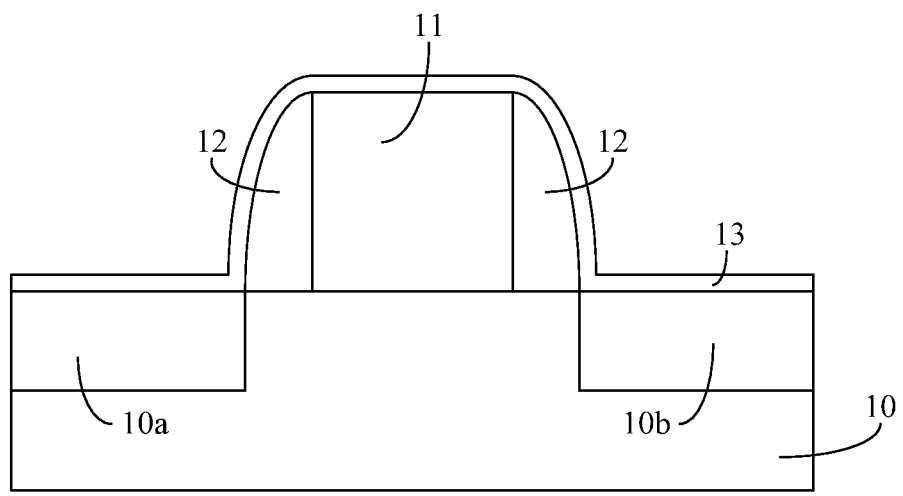
Figure 3:
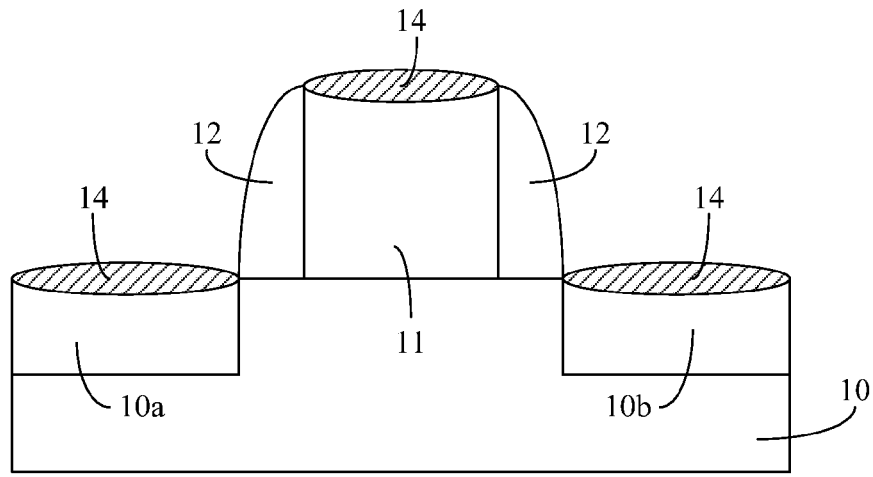
Figure 4:
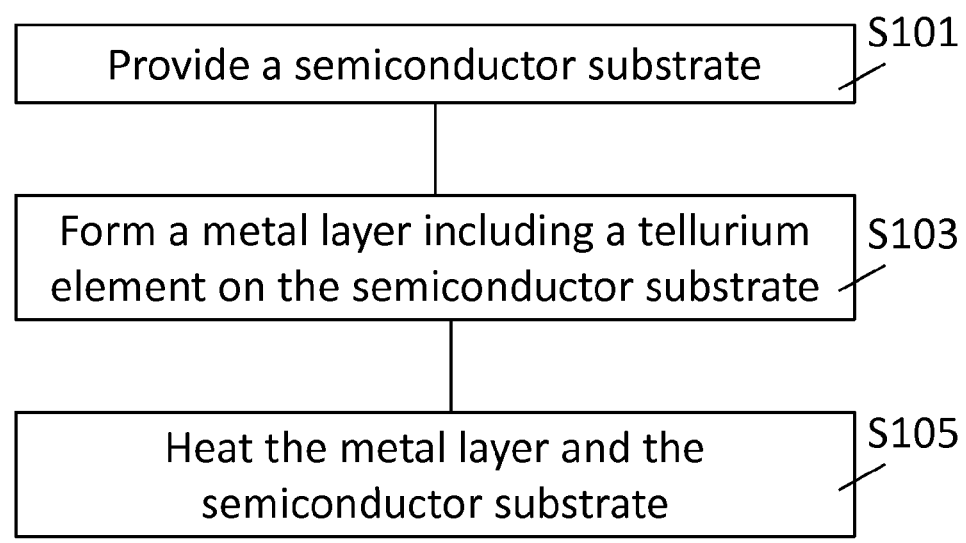
FIG. 4 is a schematic flow diagram for forming an exemplary metal silicide layer in accordance with various disclosed embodiments.
Figure 5:
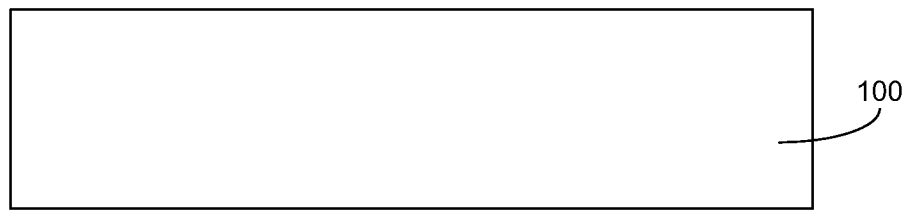
FIG. 5 through FIG. 7 are schematics of an exemplary semiconductor device at various stages during its formation in accordance with various disclosed embodiments.
Figure 6:
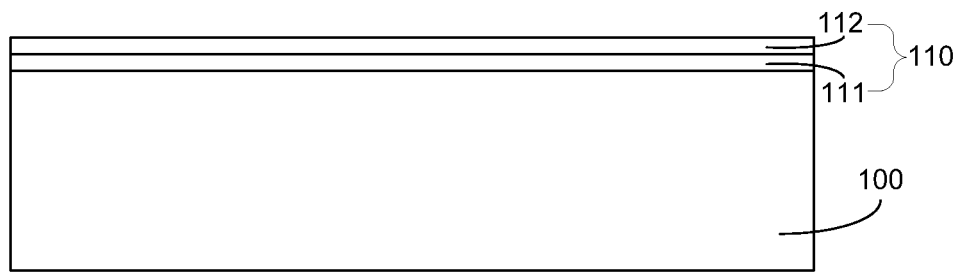
Figure 7:
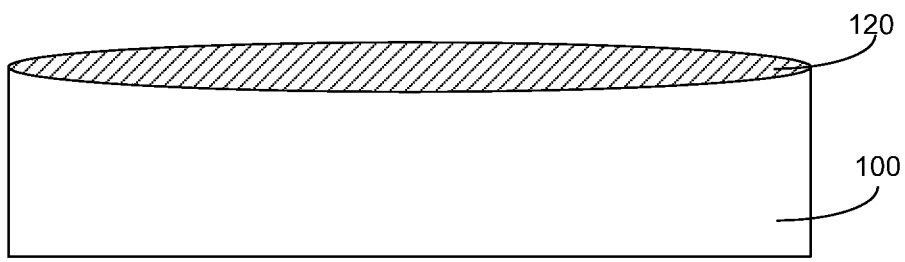

Various embodiments provide materials and methods of forming of a metal silicide layer. FIG. 4 depicts an exemplary method for forming a metal silicide layer; and FIGS. 5-7 depict an exemplary semiconductor device at various stages during its formation in accordance with various embodiments. Although the method depicted in FIG. 4 is described in conjunction with the structures depicted in FIGS. 5-7, one of ordinary skill in the art will understand that the method and the structures depicted in FIGS. 4 and 5-7 are not to be taken as limiting the disclosure or claims in any way.

At the beginning of the fabrication process, as shown in step S101 of FIG. 4, a semiconductor substrate 100 is provided (e.g., FIG. 5). The semiconductor substrate 100 can be used to form various semiconductor devices including, but not limited to, an NMOS transistor, a PMOS transistor, or any suitable devices.

At step S103 of FIG. 4, a metal layer 110 can be formed on the semiconductor substrate 100, as seen in FIG. 6. In one example, the metal layer 110 can be formed by physical vapor deposition. The metal layer 110 can include at least a tellurium element.

Exemplary physical vapor deposition for forming the metal layer 110 can include one or more processes selected from an evaporation coating, a sputtering, a plating, etc. During such process(es), tellurium element can be incorporated, e.g., into the target material for deposition. In one embodiment, the metal layer 110 can be a sputtering coating formed by the sputtering process having tellurium element added in the target material for sputtering.

In certain embodiments, the metal layer 110 can include one or more metal layers and at least one of the metal layers can include at least a tellurium element. For example, as shown in FIG. 6, the metal layer 110 can include a second metal layer 112 formed over a first metal layer 111. One or both of the metal layers 111 and 112 can include the tellurium element.

The metal layer 110 can be formed by first forming the first metal layer 111 on the semiconductor substrate 100. The first metal layer 111 can be formed by, e.g., a first sputtering process. The first metal layer 111 can be any metal-containing layer including, but not limited to, a metal element, a metal composite, a metal compound, a metal alloy, and/or combinations thereof. The first metal layer 111 may or may not include the tellurium element.

In one embodiment, the first sputtering process can include a first target material including nickel, nickel-platinum alloy, and/or other suitable metals including their composites, compounds, and/or alloys. The first target material for sputtering can include tellurium element having an atomic percentage ranging from about 0.1% to about 5%. During sputtering, an argon gas flow rate can be used ranging from about 20 sccm to about 50 sccm; and/or the power can be used ranging from about 1000 W to about 3000 W.

During the deposition, the thickness of the metal layer 111 can be controlled by various parameters, such as, for example, sputtering time. In one embodiment, for a first metal layer 111 formed by nickel or nickel-platinum alloy and having an atomic percentage of tellurium of about 0.1% to about 5%, the thickness of the first metal layer 111 can be controlled in a range of about 100 Å to 300 Å by controlling the first sputtering time. As such, required metal elements and their amounts, e.g., molar amount of the tellurium element, can be controlled and obtained in the first metal layer 111.

Still in FIG. 6, the second metal layer 112 can be formed over/on the first metal layer 111, e.g., using a second sputtering process. In one example, the second sputtering process can include a second target material including titanium, tellurium, and/or other suitable metals, metal composites, compounds, and/or alloys. The target material for the second sputtering process can include tellurium element having an atomic percentage ranging from about 0.1% to about 5%. The second sputtering process can use an argon gas flow rate ranging from about 20 sccm to about 50 sccm; a nitrogen flow rate ranging from about 50 sccm to about 150 sccm, and/or a power ranging from about 5000 W to about 15000 W.

Due to existence of nitrogen in forming the second metal layer 112, in one embodiment, the second metal layer 112 may include titanium, titanium nitride and/or tellurium. Similar to formation of the first metal layer, the thickness of the second metal layer 112 can be controllable, for example, in the range from about 50 Å to about 200 Å.

When the second metal layer 112 is a titanium nitride layer covering the first metal layer 111, the dense titanium nitride can prevent the first metal layer 111 from being oxidized by oxygen during the subsequent heating process. A metal silicide layer can thus be formed with high quality.

Note that the present disclosure is primarily based on the metal layer 110 including a double metal layer structure as shown in FIG. 6, although the metal layer 110 can include less or more than two layers and, in certain embodiments, at least one of the layer(s) in the metal layer 110 can include tellurium element. Accordingly, tellurium element can be incorporated in corresponding metal deposition(s) (e.g., sputtering) to form the metal layer 110. In the case where the metal layer 110 has one metal layer (i.e., a monolayer), this metal layer can include tellurium element and can be formed according to the methods described herein.

Referring to step S105 of FIG. 4, the structure shown in FIG. 6 including the semiconductor substrate 100 and the metal layer 110 disposed thereon can be heated to form a metal silicide layer 120 on the semiconductor substrate 100, as shown in FIG. 7.

During this heat treatment, metal elements in the metal layer 110 can react with silicon of the semiconductor substrate 100, thereby forming the metal silicide layer 120. In addition, tellurium atoms can diffuse under the heating temperature to the interface between the metal silicide layer 120 and the semiconductor substrate 100, which reduces SBH there-between. Moreover, the disclosed methods of adding tellurium atoms in the metal layer and/or thus metal silicide layer do not cause damage to the semiconductor substrate, as compared to conventional ion implantation processes, for example.

The heating process (or the heat treatment) as disclosed herein may include, for example, a rapid thermal annealing process, a heating process in the furnace, and/or other suitable heating processes. For example, the rapid thermal annealing process can be performed, e.g., at a temperature ranging from about 200° C. to about 500° C. for a time length ranging from about 20 seconds to about 60 seconds.

Optionally, following the heating process, unreacted portion of the metal layer 110 can be removed. The removal of the unreacted metal can use a mixed solution containing acid, oxidizing agent, and/or other suitable reagents. In one example, the mixed solution can include sulfuric acid and hydrogen peroxide.

By adding tellurium element in the metal layer 110 to form the metal silicide layer 120 containing tellurium, SBH between the metal silicide layer and the semiconductor substrate 110 can be reduced. When the metal silicide layer containing tellurium is used in NMOS transistors, contact resistance of the NMOS transistor can be significantly reduced.

Various embodiments also provide an NMOS transistor and method of forming the same. For example, metal silicide layers can be formed, e.g., in various regions in an NMOS transistor, depending on specific types of the transistor. In one embodiment, when the gate structure includes a polysilicon gate electrode, the metal silicate layer can be formed on the source region, drain region, and gate structure of the NMOS transistor. In another embodiment, when the gate structure includes a dummy gate electrode, the metal silicide layer can be formed on the source and drain regions.

Figure 8:
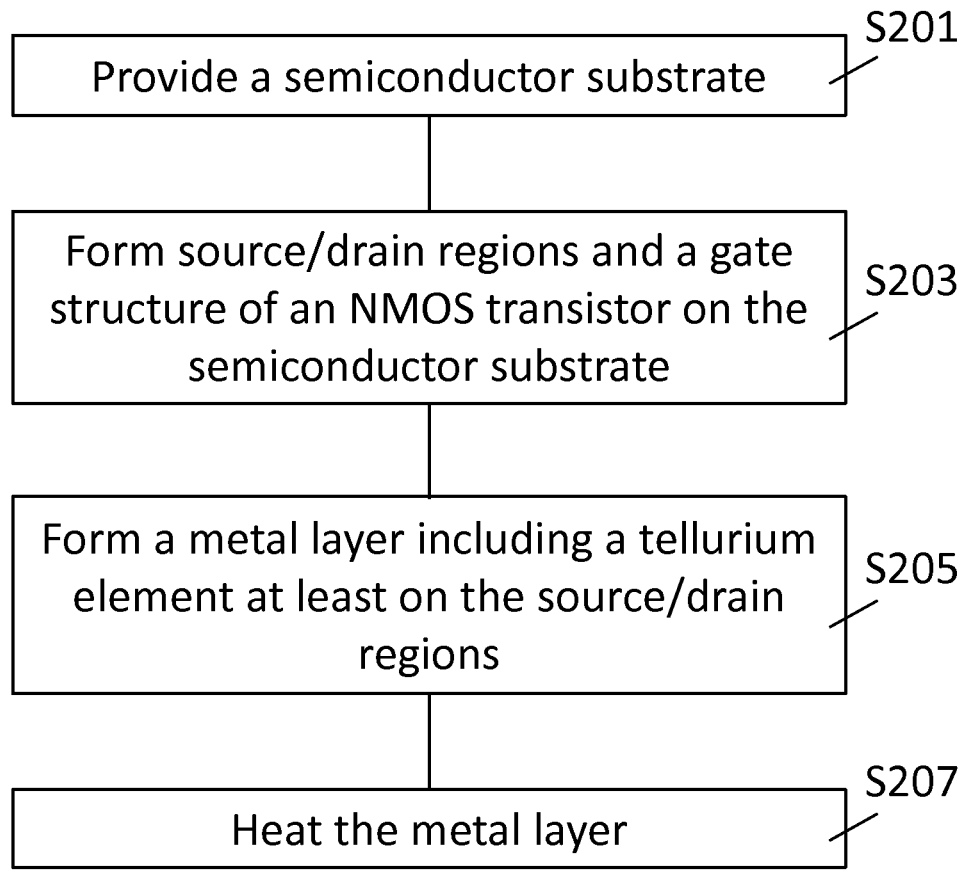
FIG. 8 is a schematic flow diagram for forming an exemplary NMOS transistor in accordance with various disclosed embodiments.

FIG. 8 illustrates an exemplary fabrication process of a semiconductor device, e.g., an NMOS transistor. FIGS. 9-12 illustrate an exemplary semiconductor device corresponding to various stages of the fabrication process in FIG. 8, e.g., using a gate-first process for forming an exemplary NMOS transistor. FIGS. 13-18 illustrate another exemplary semiconductor device corresponding to various stages of the fabrication process in FIG. 8, e.g., using a gate-last process for forming another exemplary NMOS transistor.

Figure 9:
FIG. 9 through FIG. 12 are schematics of an exemplary NMOS transistor at various stages during its formation in accordance with various disclosed embodiments.

Referring to step S201 of FIG. 8, a semiconductor substrate 200 can be provided, e.g., as shown in FIG. 9. The semiconductor substrate 200 can be the same or different than the semiconductor substrate 100 as depicted in FIGS. 4-7. The semiconductor substrate 200 can be any semiconductor substrate as known in the art including, e.g., a silicon substrate.

Figure 10:
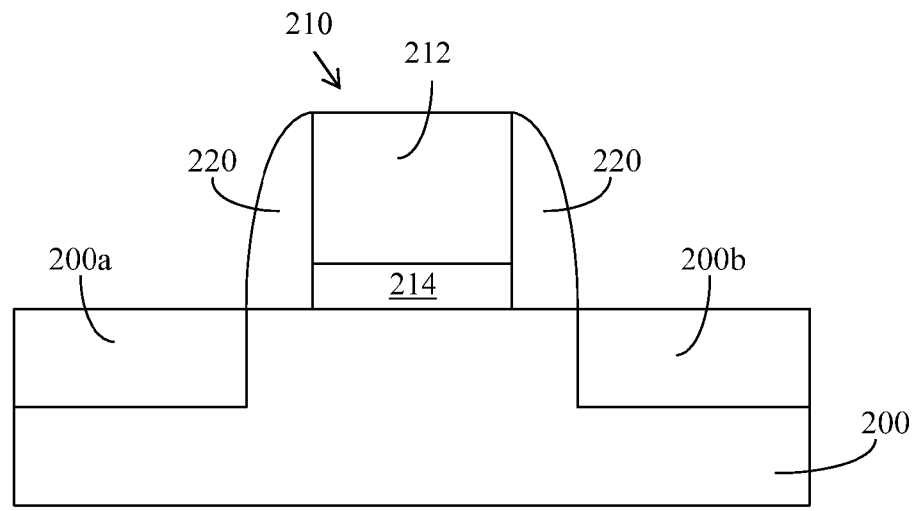

Referring to step S203 of FIG. 8, a source region 200a, a drain region 200b, and a gate structure 210 can be formed on the semiconductor substrate 200. The gate structure 210 as shown in FIG. 10 can include a gate electrode 212 formed on a gate dielectric layer 214 on the semiconductor substrate 200. In other words, the gate dielectric layer 214 is formed between the gate electrode 212 and the semiconductor substrate 200. Sidewall spacers 220 can be formed surrounding the gate structure 210, as shown in FIG. 10. In certain embodiments, the gate structure 210 can include a polysilicon gate electrode.

For some NMOS transistors, sidewall spacers 220 may not formed at this stage. In this case, a protective layer (not shown) can be formed on the NMOS transistors prior to forming the metal layer. No metal silicide layers can be formed on the sidewall of the gate structure 210, e.g., during the heating process. The protective layer can further include a through-opening to expose surface regions of, e.g., the source region 200a, the drain region 200b, and the gate structure 210, for forming the metal layer/the metal silicide layer thereon. In certain embodiments, the protective layer can be made of a material including, but not limited to, silicon nitride or silicon oxide. Such protective layer having a through opening can be formed using, e.g., lithography, etching process, and/or any other specific steps as well known to those skilled in the art.

At step S205 of FIG. 8, a metal layer 230 can be formed on the exemplary structure shown in FIG. 10, including the source region 200a, the drain region 200b, and the gate structure 210. In an exemplary embodiment, the metal layer 230 can be the same or different than the metal layer 110 as depicted in FIG. 6. For example, the metal layer 230 may include a double-layered structure having a second metal layer 232 (e.g., the second metal layer 112) formed over a first metal layer 231 (e.g., the first metal layer 111). Alternatively, the metal layer 230 may be a monolayer.

In manufacturing, the metal layer 230 and/or the metal layer 110 can be formed by blanket deposition of desired metal(s), i.e., the metal layer can be formed to cover the entire surface of the NMOS transistor.

Because the sidewall spacers 220 do not react with the metal layer 230 in the subsequent heating process, no metal silicide can be formed on the sidewall spacers 220.

Alternatively, as described above, the metal layer (e.g., the metal layer 110 in FIG. 6 and/or 230 in FIG. 11) can be deposited on exposed regions through an opening of a protective layer (not shown) as described above. The opening can expose the source region, the drain region, and the gate structure of the NMOS transistor, so that the metal layer can react with the underlying silicon material to form a metal silicide layer on each of the source region, the drain region, and the gate structure of the NMOS transistor.

Figure 11:
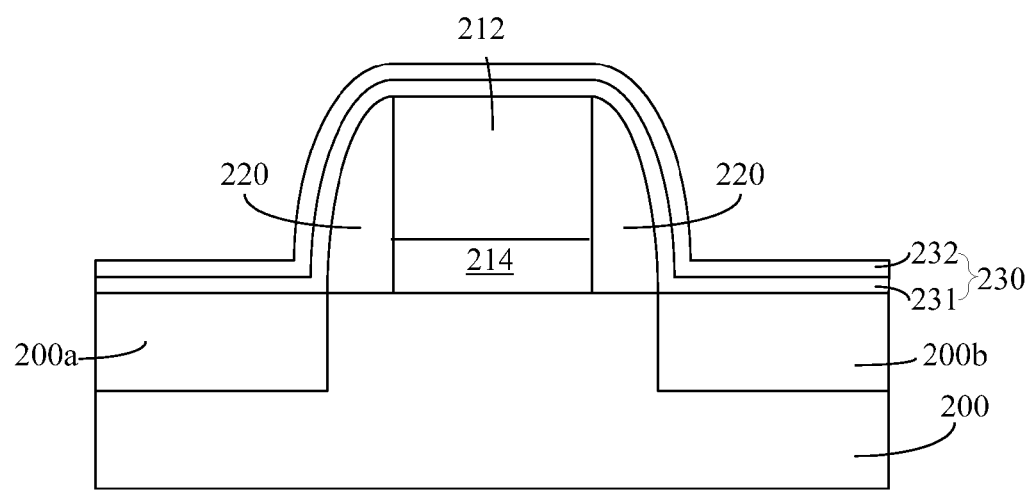
Figure 12:
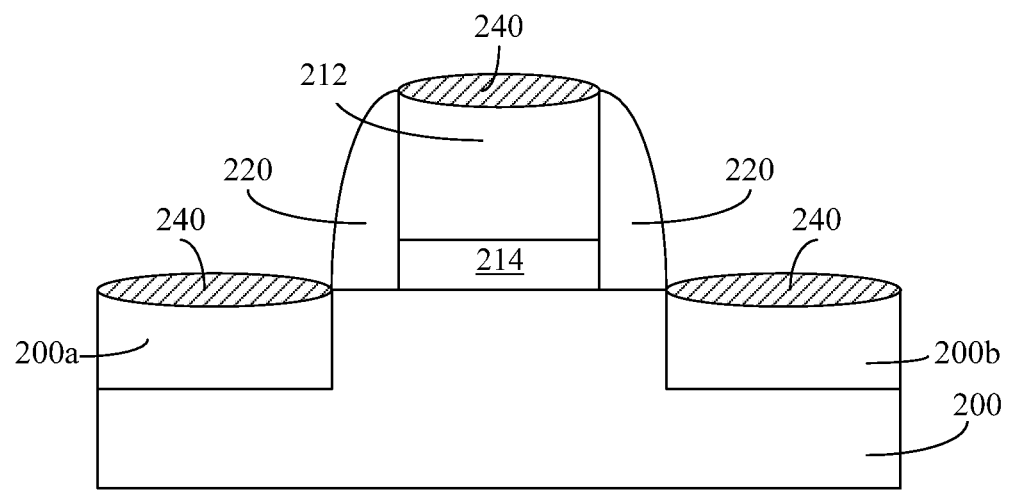

At step S207 of FIG. 8, a heating process can be performed to the NMOS transistor, e.g., FIG. 11, to form a metal silicide layer 240 on each of the source region 200a, the drain region 200b, and the gate structure 210 of the NMOS transistor as shown in FIG. 12.

Metal elements in the metal layer 230 can react with silicon material in the underlying regions of the NMOS transistor during heating to generate metal silicides. At the heating temperature, tellurium atoms can diffuse to the interface between the formed metal silicide and the underlying silicon, which reduces SBH there-between. Contact resistance of the source, drain and gate of the NMOS transistor can thus be reduced. Any suitable heating process can be used to form metal silicides. In this manner, the disclosed methods including incorporating tellurium atom in the metal layer and/or corresponding metal silicide layer do not cause damage to the formed NMOS transistor, as compared to conventional ion implantation processes.

Referring back to FIG. 12, note that the metal layer 230 does not react with the sidewall spacer 220 (e.g., formed of silicon oxide or silicon nitride). The metal silicide layer 240 can be formed on the source region 220a, the drain region 220b, and the gate structure 210.

Optionally, following the heating process, the unreacted portion of the metal layer 230 can be removed. The removal of the unreacted metal can use a mixed solution containing acid, oxidizing agent, and/or other suitable reagents. In one example, the mixed solution can include sulfuric acid and hydrogen peroxide.

FIGS. 13 to 18 depict another exemplary semiconductor device at various stages during its formation in accordance with the exemplary method depicted in FIG. 8.

Figure 13:
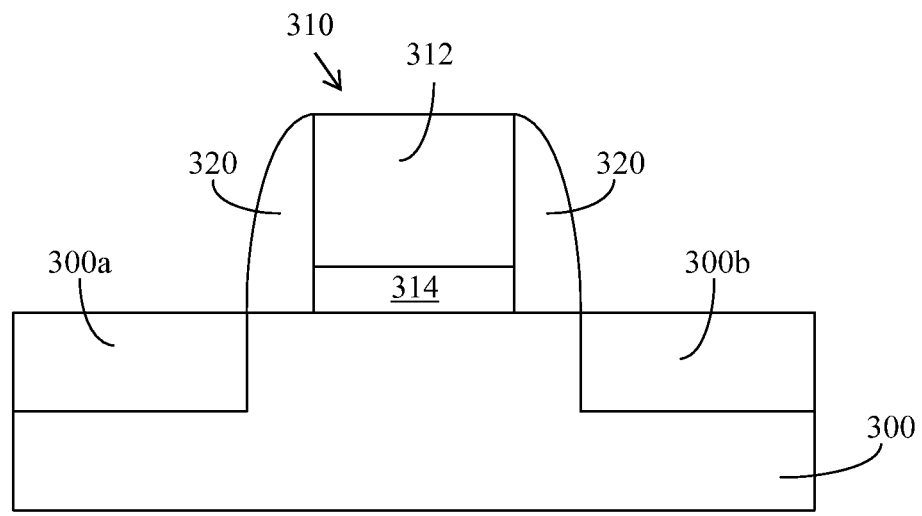
FIG. 13 through FIG. 18 are schematics of another exemplary NMOS transistor at various stages during its formation in accordance with various disclosed embodiments.

According to steps S201 and S203 of FIG. 8 and corresponding structures in FIG. 13, a semiconductor substrate 300 can be provided; and a source region 300a, a drain region 300b, and a gate structure 310 of an exemplary NMOS transistor can be formed on the semiconductor substrate 300. The gate structure 310 as shown in FIG. 13 can include a gate electrode 312 on a gate dielectric layer 314 formed on the semiconductor substrate 300. In other words, the gate dielectric layer 314 is formed between the gate electrode 312 and the semiconductor substrate 300. Sidewall spacers 320 can also be formed surrounding the gate structure 310. The structure shown in FIG. 13 can be similar to the NMOS transistor structure as shown in FIG. 10 except that the gate electrode 312 is a dummy gate (e.g., polysilicon) and a gate-last process is used.

In a gate-last process, a dummy gate can be formed by, e.g., deposition of a polysilicon gate, which can be removed after metal silicide is formed at source/drain region, for example. The dummy gate can be removed by any suitable etching processes such as a dry etching process. Metals can then be filled to form a metal gate.

Accordingly, a metal silicide layer can be formed on the source region 300a and the drain region 300b in a gate-last process, while the metal silicide layer is not formed on the gate structure 310 including the dummy gate 312. In some cases if the metal silicide layer is formed on the dummy gate, the metal silicide layer will be removed later together with the dummy gate. Because removing metal silicides requires complex processes, in certain embodiments, a protective layer can be formed over/on the gate structure 310 including the dummy gate to avoid forming metal silicides thereof.

Figure 14:
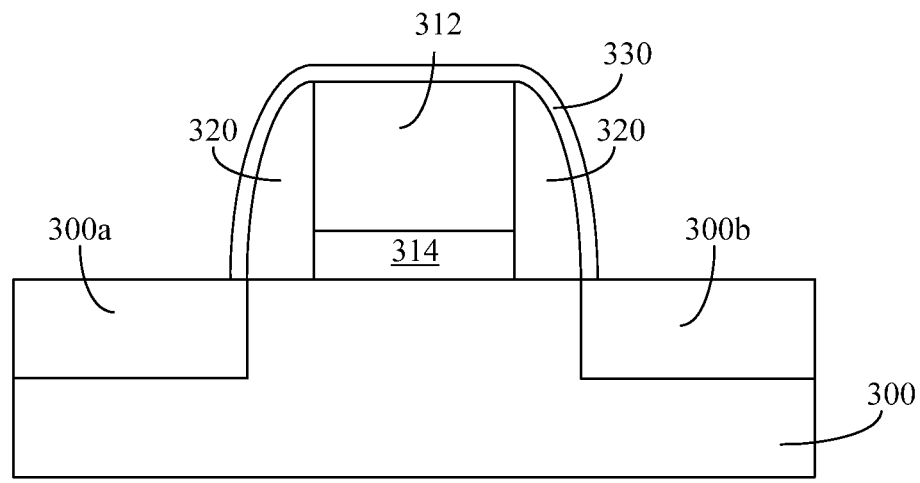

For example, referring to FIG. 14, prior to forming a metal layer 340, a protective layer 330 can be formed on the NMOS transistor structure shown in FIG. 13. The protective layer 330 can have an opening to expose regions of the source region 300a and the drain region 300b. The gate structure 310 can be covered by the protective layer 330.

Figure 15:
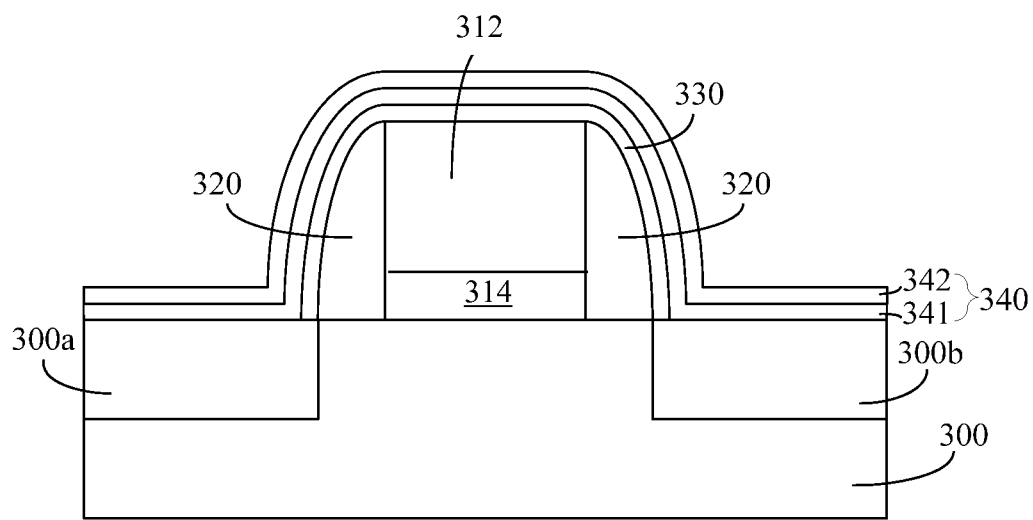

At step S205 of FIG. 8, a metal layer 340 can be formed on/over each of the exposed source region 300a, the exposed drain region 300b, and the gate structure 310 having the protective layer 330, as shown in FIG. 15. Because of the protective layer 330, the metal layer 340 may be formed directly on the protective layer 330 instead of directly on the gate structure 310. The metal layer 340 can be the same or different than the metal layer 110 in FIG. 6 (or the metal layer 230 in FIG. 10). For example, the metal layer 340 may include a double-layered structure having a second metal layer 342 (e.g., the second metal layer 112) formed over a first metal layer 341 (e.g., the first metal layer 111). Alternatively, the metal layer 340 may be a monolayer.

Figure 16:
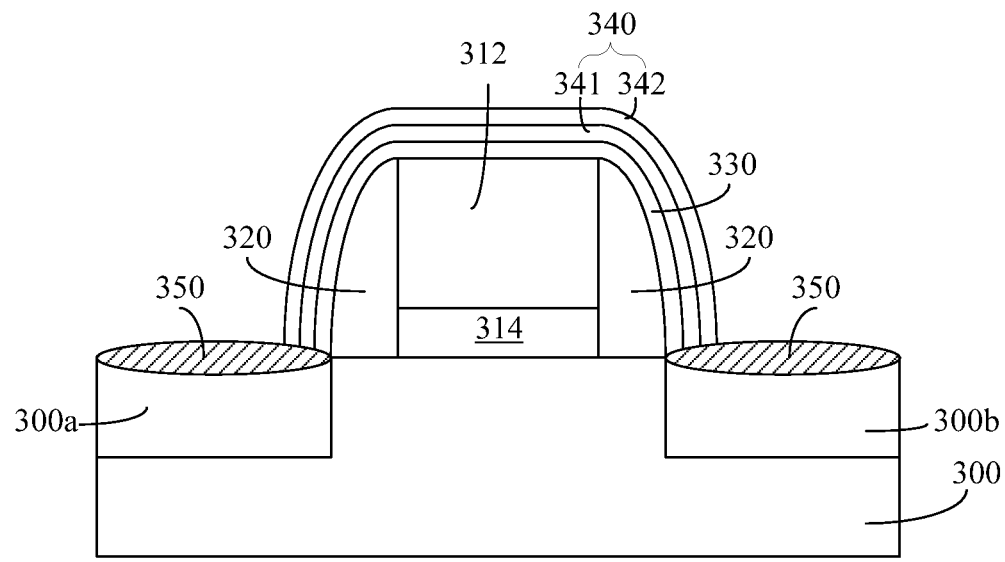

At step S207 in FIG. 8, the NMOS transistor structure shown in FIG. 15 can be heated to form a metal silicide layer 350 on the source region 300a and the drain region 300b, as shown in FIG. 16. No metal silicide is formed over the gate structure 310, because the metal layer 340 does not react with the protective layer 330 even when heated.

Figure 17:
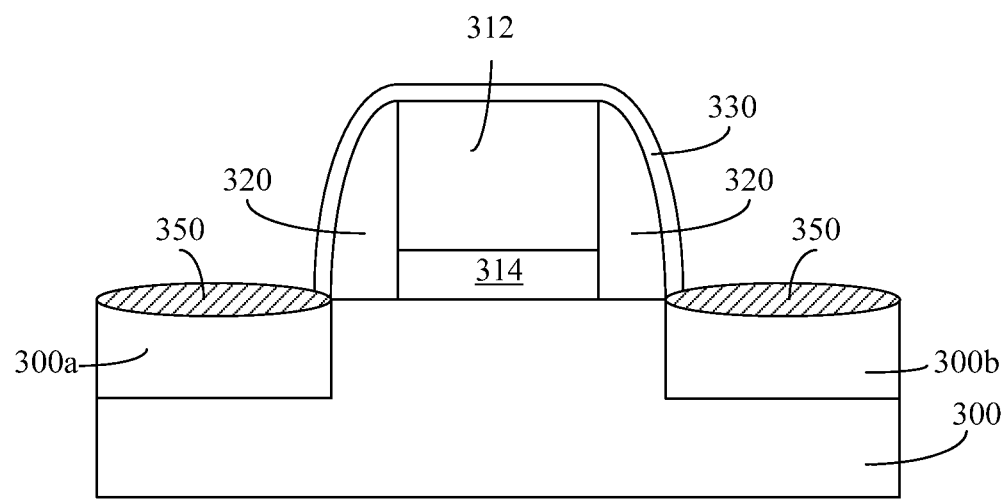

In certain embodiments, the unreacted portion of the metal layer 340 over the gate structure 310, and/or possibly over the source/drain region 300a-b, as shown in FIG. 17, can be removed. Removal of the unreacted metal can use a mixed solution as disclosed above, leaving the protective layer 330 covering the gate structure 310 and the sidewall spacer 320.

Figure 18:
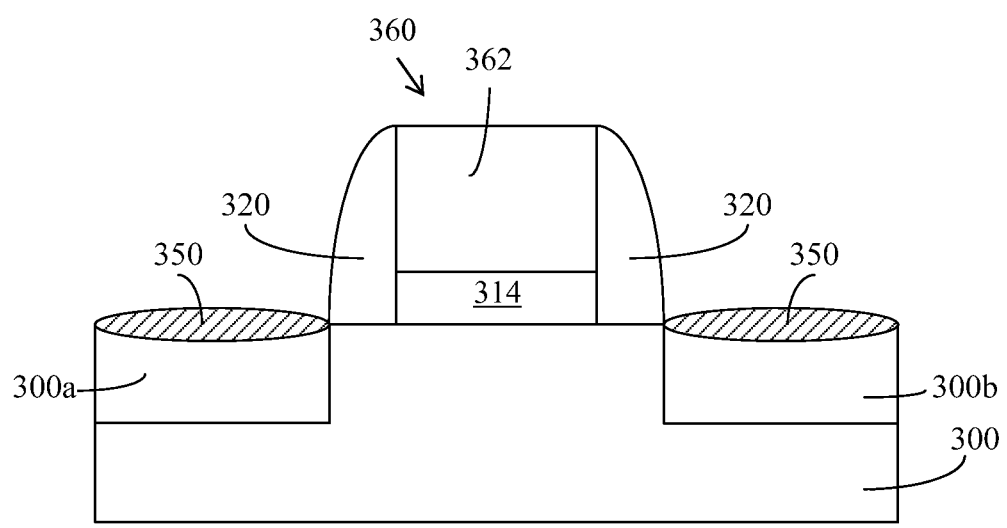

In FIG. 18, the protective layer 330 along with the dummy gate 312 of the gate structure 310 in FIG. 17 can be removed and a second gate structure 360 can be formed. Depending on the materials used for the protective layer 330, any suitable materials and methods known in the art can be used herein to remove the protective layer. As shown in FIG. 18, the second gate structure 360 may include an exemplary metal gate structure including, e.g., a metal gate electrode 362 on the gate dielectric layer 314. The metal gate structure 360 can be formed using materials and methods known in the art.

In this manner, the present disclosure provides various advantages. For example, the metal silicide layer containing at least tellurium can be formed by adding tellurium in a corresponding metal layer, followed by a heating process. SBH between metal silicide and the underlying silicon can be reduced and thus the contact resistance of the NMOS transistor can be reduced. In another example, tellurium can be incorporated into physical vapor deposition for forming the desired metal layer, which does not require additional manufacturing steps or any further adjustments on instruments, saving time and manufacturing cost. Moreover, the disclosed methods for forming a metal silicide layer at least containing tellurium do not cause damage to the semiconductor substrate and/or related transistors, as compared to conventional ion implantation processes. Furthermore, the metal layer may include a first metal layer and a second metal layer over the first metal layer, where the second metal layer is a dense metal layer (e.g., titanium nitride metal layer). Thus, the sense second metal layer can protect the metal layer from oxidation when heated on a semiconductor substrate.

Other applications, advantages, alternations, modifications, or equivalents to the disclosed embodiments are obvious to those skilled in the art.

What is claimed is:

1. A fabrication method comprising:
providing a semiconductor substrate for fabricating an NMOS transistor;
using a tellurium-doped target metal material to form a tellurium-containing metal layer;
forming a metal layer including a double-layered structure on the semiconductor substrate, wherein the metal layer is formed by:
   forming a first metal layer on the semiconductor substrate by a first physical vapor deposition using a first target material containing tellurium, and
   forming a second metal layer over the first metal layer by a second physical vapor deposition, wherein the second metal layer is the tellurium-containing metal layer comprising a tellurium-containing titanium nitride layer; and
heating the metal layer by a rapid thermal annealing process at a temperature ranging from about 200° C. to about 500° C. for a time length ranging from about 20 seconds to about 60 seconds, such that the first metal layer is silicidized at an interface with the semiconductor substrate and such that, during the heating, atoms of tellurium element in the second metal layer are diffused from the second metal layer to the silicidized interface to form a metal silicide layer on the semiconductor substrate, wherein the metal silicide layer includes at least the tellurium element.

2. The method of claim 1, wherein the first target material comprises nickel or nickel-platinum alloy; and wherein the second physical vapor deposition uses a second target material.

3. The method of claim 2, wherein the tellurium element has an atomic percentage from about 0.1% to about 5% in each of the first target material and the second target material.

4. The method of claim 1, wherein the first physical vapor deposition uses an argon gas flow rate ranging from about 20 sccm to about 50 sccm and a power ranging from about 1000 W to about 3000 W.

5. The method of claim 1, wherein the second physical vapor deposition uses an argon gas flow rate ranging from about 20 sccm to about 50 sccm, a nitrogen gas flow rate ranging from about 50 sccm to about 150 sccm, and a power ranging from about 5000 W to about 15000 W.

6. The method of claim 1, wherein the second metal layer is denser than the first metal layer to prevent oxidization of the first metal layer during the heating.

7. The method of claim 1, wherein the tellurium-containing titanium nitride (TiN) layer is a TiN-Te capping layer.

8. A fabrication method comprising:
providing a semiconductor substrate;
forming a source region, a drain region, and a gate structure of an NMOS transistor on the semiconductor substrate;
using a tellurium-doped target metal material to form a tellurium-containing metal layer;
forming a metal layer including a double-layered structure on the source region, the drain region, and the gate structure by a physical vapor deposition, wherein the metal layer is formed by:
  forming a first metal layer using a first target material containing tellurium on the source region, the drain region, and the gate structure, and
  forming a second metal layer over the first metal layer, wherein at least the second metal layer is the tellurium-containing metal layer comprising a tellurium-containing titanium nitride layer; and
heating the metal layer by a rapid thermal annealing process at a temperature ranging from about 200° C. to about 500° C. for a time length ranging from about 20 seconds to about 60 seconds, such that the first metal layer is silicidized at least at an interface with the source region and the drain region, and such that, during the heating, atoms of tellurium element in the second metal layer are diffused from the second metal layer to the silicidized interface to form a metal silicide layer at least on the source region and the drain region, wherein the metal silicide layer includes at least the tellurium element.

9. The method of claim 8, further comprising:
forming a protective layer having an opening on the NMOS transistor to expose the source region, the drain region, and the gate structure, wherein the gate structure comprises a polysilicon gate electrode; and
forming the metal layer on each of the source region, the drain region, and the gate structure.

10. The method of claim 8, further comprising:
forming a protective layer on the NMOS transistor to expose the source region and the drain region, wherein the gate structure comprises a dummy gate; and
forming the metal layer on each of the protective layer, the source region, and the drain region.

11. The method of claim 10, further comprising:
removing the dummy gate and the protective layer, following formation of the metal silicide layer; and
forming a metal gate electrode.

12. The method of claim 8, further comprising using a mixture of acid and an oxidant to remove unreacted portion of the metal layer following formation of the metal silicide layer.

13. An NMOS transistor semiconductor device comprising:
a semiconductor substrate;
a source region, a drain region, and a gate structure of an NMOS transistor disposed on the semiconductor substrate; and
a metal layer including a double-layered structure on the source region, the drain region, and the gate structure,
wherein the metal layer is formed by: forming a first metal layer using a first target material containing tellurium on the source region, the drain region, and the gate structure, and forming a second metal layer over the first metal layer, wherein at least the second metal layer is the tellurium-containing metal layer comprising a tellurium-containing titanium nitride layer, and wherein the metal layer is heated by a rapid thermal annealing process at a temperature ranging from about 200° C. to about 500 ° C. for a time length ranging from about 20 seconds to about 60 seconds, such that the first metal layer is silicidized at least at an interface with the source region and the drain region, and such that, during the heating, atoms of tellurium element in the second metal layer are diffused from the second metal layer to the silicidized interface to form a metal silicide layer disposed at least on the source region and the drain region, and wherein the metal silicide layer comprises the tellurium element to provide the metal silicide layer with a reduced contact resistance.

14. The device of claim 13, wherein the metal silicide layer further comprises one or more elements of nickel, platinum, titanium, or titanium nitride.

15. The device of claim 13, wherein the metal silicide layer is disposed on each of the source region, the drain region, and the gate structure, wherein the gate structure comprises a polysilicon gate.

16. The device of claim 13, wherein the metal silicide layer is disposed on each of the source region and the drain region, wherein the gate structure comprises a dummy gate.

* * * * *